US010002932B2

(12) United States Patent
Xie et al.

(10) Patent No.: US 10,002,932 B2
(45) Date of Patent: Jun. 19, 2018

(54) SELF-ALIGNED CONTACT PROTECTION USING REINFORCED GATE CAP AND SPACER PORTIONS

(71) Applicant: GLOBALFOUNDRIES Inc., Grand Cayman (KY)

(72) Inventors: Ruilong Xie, Schenectady, NY (US); Min Gyu Sung, Latham, NY (US); Hoon Kim, Horseheads, NY (US); Chanro Park, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/345,137

(22) Filed: Nov. 7, 2016

(65) Prior Publication Data

US 2018/0130889 A1    May 10, 2018

(51) Int. Cl.
  *H01L 29/417*   (2006.01)
  *H01L 21/8234*  (2006.01)
  *H01L 21/3205*  (2006.01)
  *H01L 29/45*    (2006.01)
  *H01L 21/3105*  (2006.01)
  *H01L 27/088*   (2006.01)
  *H01L 29/66*    (2006.01)

(52) U.S. Cl.
  CPC .. *H01L 29/41791* (2013.01); *H01L 21/31051* (2013.01); *H01L 21/32053* (2013.01); *H01L 21/823418* (2013.01); *H01L 21/823431* (2013.01); *H01L 21/823475* (2013.01); *H01L 27/0886* (2013.01); *H01L 29/45* (2013.01); *H01L 29/665* (2013.01)

(58) Field of Classification Search
  CPC ................................. H01L 29/41791
  See application file for complete search history.

(56) References Cited

U.S. PATENT DOCUMENTS

2015/0318178 A1*  11/2015  Pham .................. H01L 21/28
                                                         257/288
2016/0163648 A1*  6/2016  Peter ................. H01L 21/28518
                                                         257/754

* cited by examiner

*Primary Examiner* — Marcos D Pizarro
*Assistant Examiner* — Shannon Yi
(74) *Attorney, Agent, or Firm* — Heslin Rothenberg Farley and Mesiti PC; Nicholas Mesiti

(57) ABSTRACT

A method includes providing a starting structure, the starting structure including a semiconductor substrate, sources and drains, a hard mask liner layer over the sources and drains, a bottom dielectric layer over the hard mask liner layer, metal gates between the sources and drains, the metal gates defined by spacers, gate cap openings between corresponding spacers and above the metal gates, and a top dielectric layer above the bottom dielectric layer and in the gate cap openings, resulting in gate caps. The method further includes removing portions of the top dielectric layer, the removing resulting in contact openings and divot(s) at a top portion of the spacers and/or gate caps, and filling the divot(s) with etch-stop material, the etch-stop material having an etch-stop ability better than a material of the spacers and gate cap. A resulting semiconductor structure is also disclosed.

12 Claims, 10 Drawing Sheets

SELF-ALIGNED CONTACT PROTECTION USING REINFORCED GATE CAP AND SPACER PORTIONS

BACKGROUND OF THE INVENTION

Technical Field

The present invention generally relates to reducing or eliminating gate cap and spacer loss in fabricating self-aligned contacts. More particularly, the present invention relates to protecting self-aligned contacts by reinforcing portions of the gate cap and spacers prior to forming the self-aligned contacts.

Background Information

As semiconductor devices continue to downsize, manufacturers have had to adapt fabrication processes. For example, self-aligned contacts have been adopted to address misaligning due to size reduction. However, where self-aligned contacts use a hard mask gate cap as an etch-stop, various other processes, such as limited etch selectivity to gate cap/spacer material during plasma etch for the contact, can cause gate cap and/or spacer loss, which can be detrimental to self-aligned contact formation.

SUMMARY OF THE INVENTION

Thus, there is a need for solutions to reduce or eliminate gate cap and/or spacer loss.

The shortcomings of the prior art are overcome and additional advantages are provided through the provision, in one aspect, of a method of reducing or eliminating gate cap and spacer loss in fabricating self-aligned contacts. The method includes providing a starting structure, the starting structure including a semiconductor substrate, a plurality of sources and drains, a hard mask liner layer over the plurality of sources and drains, a bottom dielectric layer over the hard mask liner layer, a plurality of metal gates between the plurality of sources and drains, the plurality of metal gates defined by spacers, gate cap openings between corresponding spacers and above the plurality of metal gates, and a top dielectric layer above the bottom dielectric layer and in the gate cap openings, resulting is gate caps. The method further includes removing portions of the top dielectric layer, the removing resulting in contact openings and at least one divot at a top portion of one or more of the spacers and gate caps, and filling the at least one divot with etch-stop material, the etch-stop material having an etch-stop ability better than a material of the spacers and gate cap.

In accordance with another aspect, a semiconductor structure is provided. The semiconductor structure includes a semiconductor substrate, a source, a drain, a gate structure between the source and the drain, the gate structure including a conductive gate electrode and gate cap including a gate cap material, the gate cap being situated between a pair of spacers including a spacer material, a top portion of the gate cap having at least one divot therein filled with an etch-stop material, the etch-stop material having a better etch-stop ability than the spacer material and the gate cap material, the etch-stop material being present only in the at least one divot, and the at least one divot having a non-uniform size. The semiconductor structure further includes at least one source contact and at least one drain contact, a respective contact covering each divot.

These, and other objects, features and advantages of this invention will become apparent from the following detailed description of the various aspects of the invention taken in conjunction with the accompanying drawings.

DETAILED DESCRIPTION OF THE INVENTION

Figure 1:
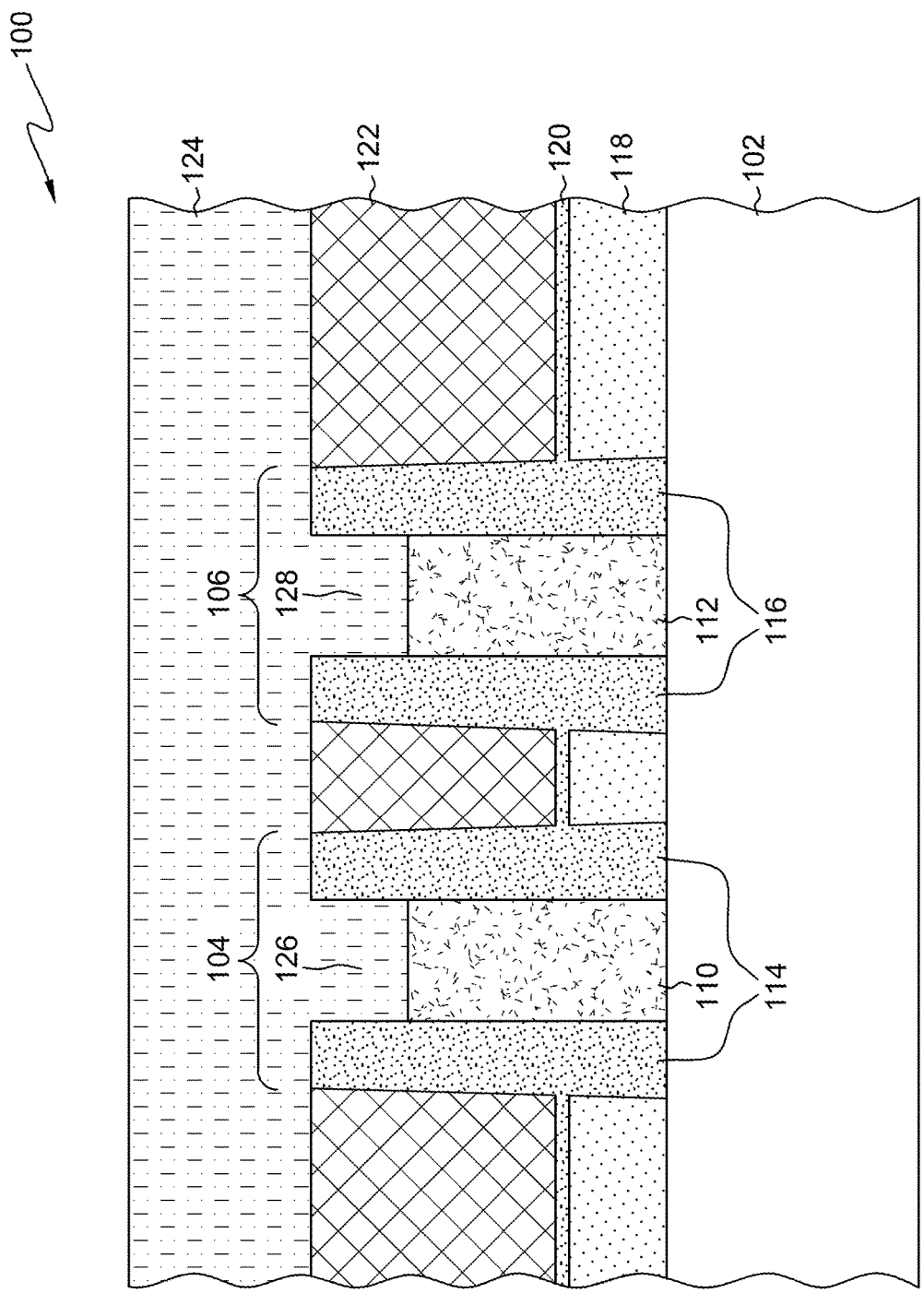
FIG. 1 is a cross-sectional view of one example a starting structure 100, the starting structure including a semiconductor substrate (which could instead be a fin on a substrate), gate structures, the gate structures including recessed metal gate electrodes between spacer pairs, sources/drains, a hard mask liner layer over the sources/drains, a bottom dielectric layer over the hard mask liner layer, and a top dielectric layer over the bottom dielectric layer that also forms gate caps, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value.

Reference is made below to the drawings, which are not drawn to scale for ease of understanding, wherein the same reference numbers are used throughout different figures to designate the same or similar components.

FIG. 1 is a cross-sectional view of one example a starting structure 100, the starting structure including a semiconductor substrate 102 (which could instead be a fin on a substrate), gate structures 104 and 106, the gate structures including recessed metal gate electrodes 110, 112 between spacer pairs 114, 116, sources/drains (e.g., source/drain 118), a hard mask liner layer 120 over the sources/drains, a bottom dielectric layer 122 over the hard mask liner layer, and a top dielectric layer 124 (e.g., a nitride) that also forms gate caps 126, 128, in accordance with one or more aspects of the present invention.

The starting structure may be conventionally fabricated, for example, using known processes and techniques. However, although only a portion is shown for simplicity, it will be understood that, in practice, many such structures are typically included on the same substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, where fin(s) are present, they may be etched from a bulk substrate, and may include, for example, any of the materials listed above with respect to the substrate. Further, some or all of the fin(s) may include added impurities (e.g., by doping), making them n-type or p-type.

Figure 2:
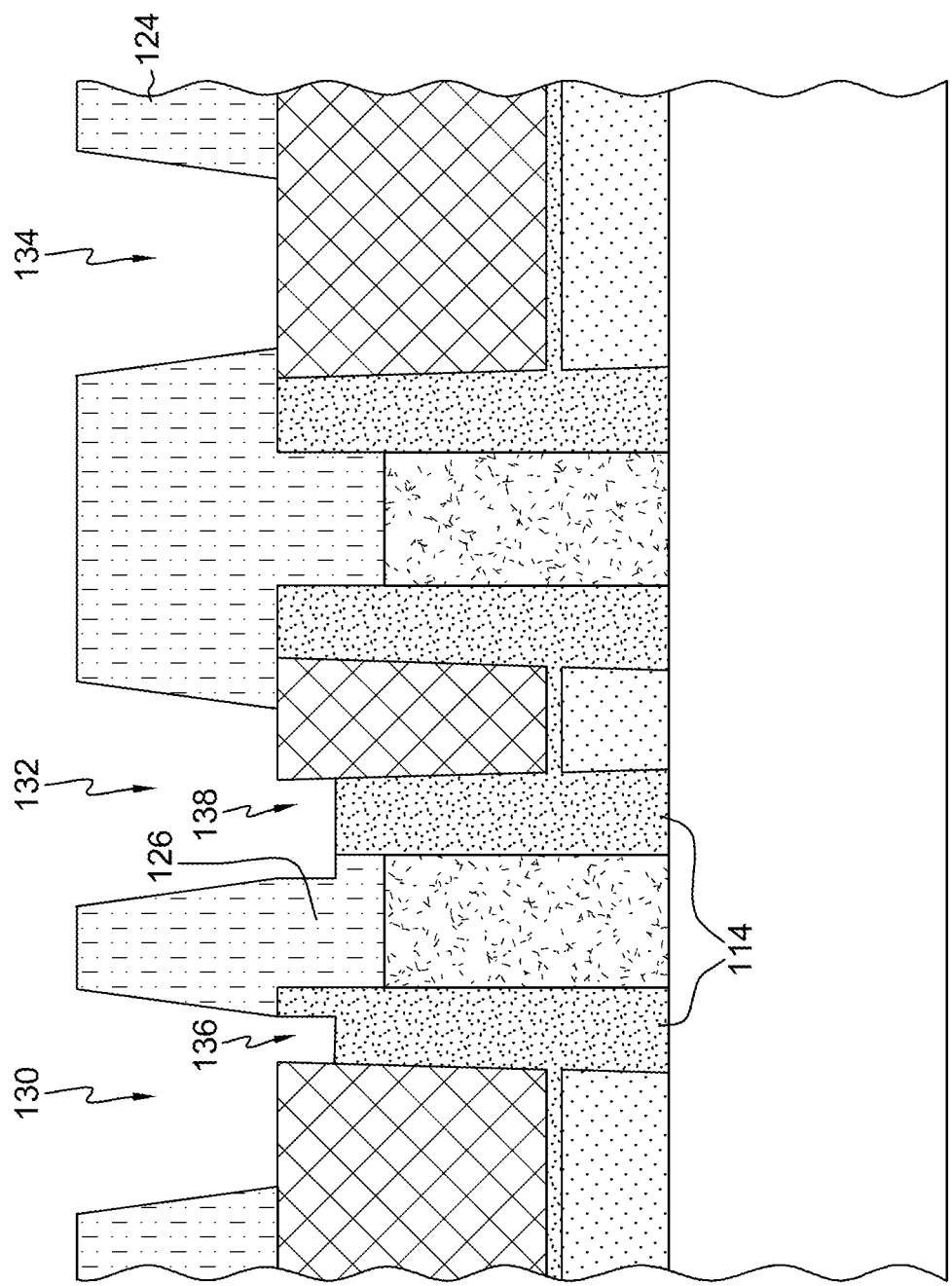
FIG. 2 depicts one example of the starting structure of FIG. 1 after forming openings in the top dielectric layer, and removing portions of a spacer pair and a gate cap to form divots, in accordance with one or more aspects of the present invention.

FIG. 2 depicts one example of the starting structure of FIG. 1 after forming contact openings 130, 132, and 134 in top dielectric layer 124, and removing portions of spacer pair 114 and gate cap 126 to form divots 136 and 138, where the size of the divots is dependent on how much overlap between a given contact opening and gate cap and/or spacer below, in accordance with one or more aspects of the present invention.

Figure 3:
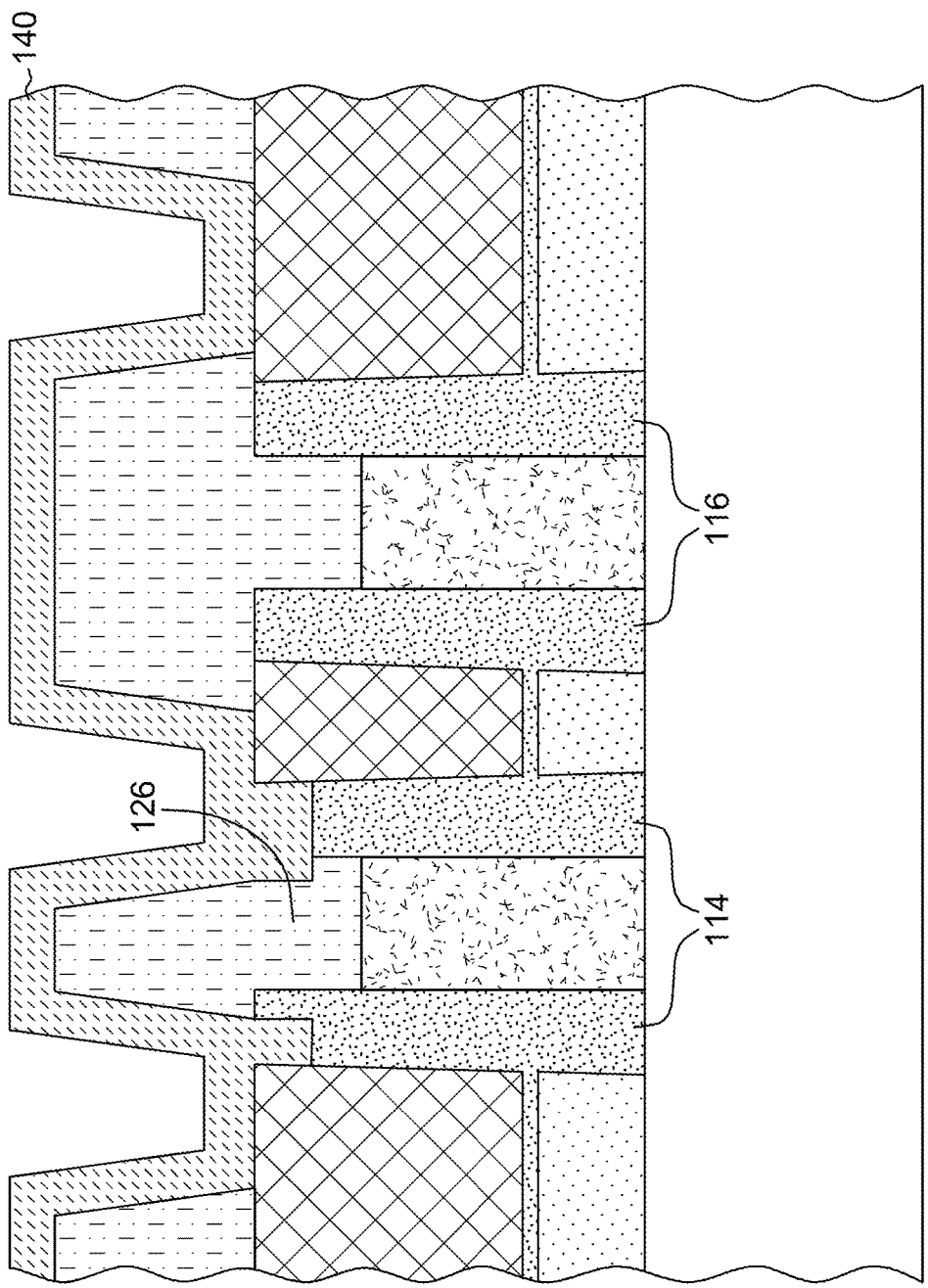
FIG. 3 depicts one example of the structure of FIG. 2 after forming an etch-stop layer thereover, which also fills in the divots, the etch-stop layer having a better etch stop ability than the materials of the spacers and gate cap, in accordance with one or more aspects of the present invention.

FIG. 3 depicts one example of the structure of FIG. 2 after forming an etch-stop layer 140 thereover, which also fills in the divots (FIG. 2, 136, 138), the etch-stop layer having a better etch stop ability than materials of spacers 114, 116 and gate cap 126, in accordance with one or more aspects of the present invention.

Where the structure is silicon-based, the etch-stop layer may include, for example, silicon carbonitride (SiCN), hafnium dioxide ($HfO_2$), aluminum oxide ($A_2O_3$), silicon carbonoxide (SiCO), and the like, while the gate cap and spacers may include, for example, hard mask material such as, for example, a nitride (e.g., silicon nitride (SiN), Silico-Boron-CarboNitride (SiBCN), or SiCO).

Figure 4:
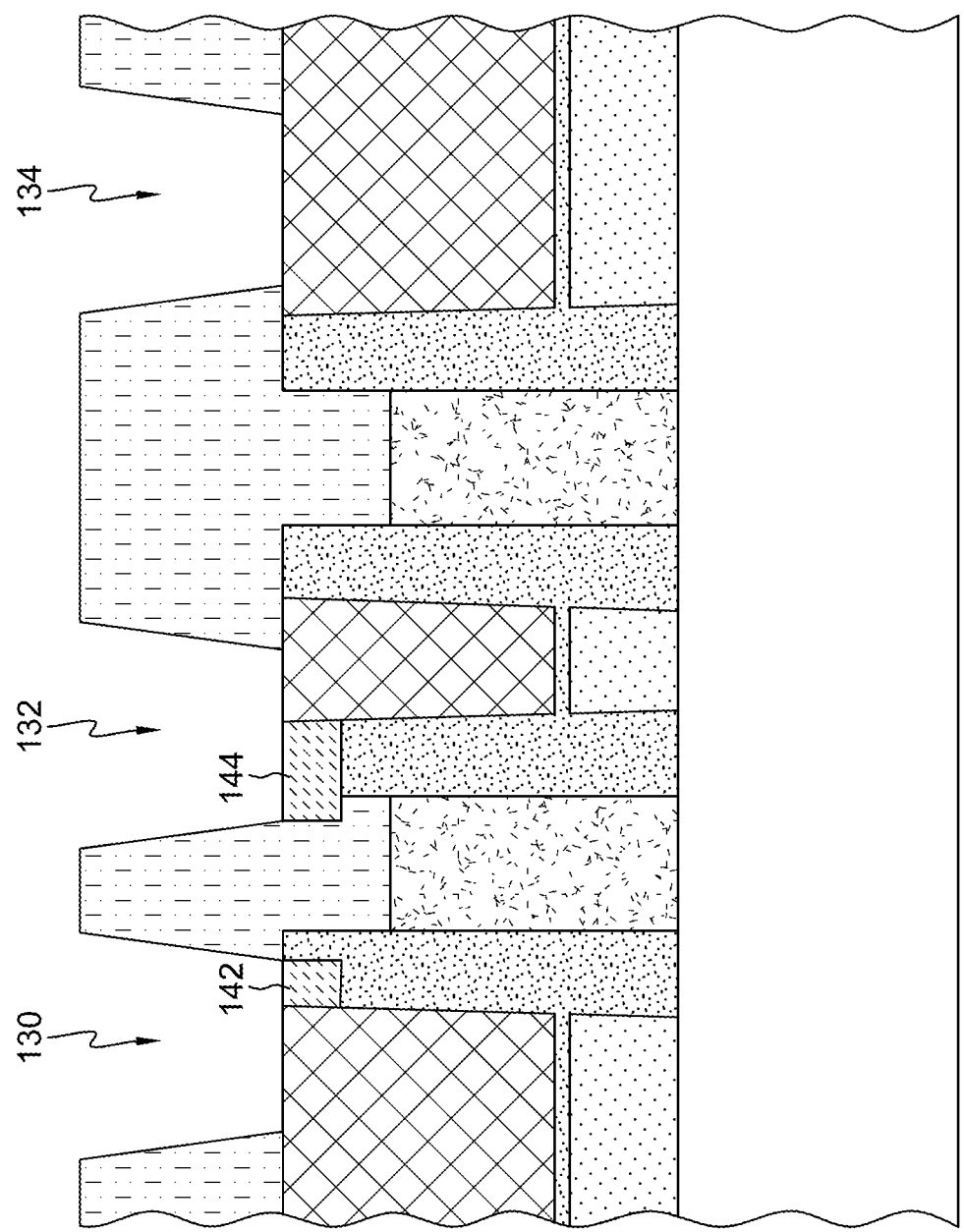
FIG. 4 depicts one example of the structure of FIG. 3 after removing the conformal etch-stop layer from the contact openings, while filled divots remain, in accordance with one or more aspects of the present invention.

FIG. 4 depicts one example of the structure of FIG. 3 after removing the conformal etch-stop layer (FIG. 3, 140) from contact openings 130, 132 and 134, while filled divots 142, 144 remain, in accordance with one or more aspects of the present invention. In one example, removing the etch-stop layer may be accomplished using an isotropic etch process.

As shown in FIG. 4, the divots can have a width smaller than a width of the spacers, or larger than the spacer width and extending into the gate cap.

Figure 5:
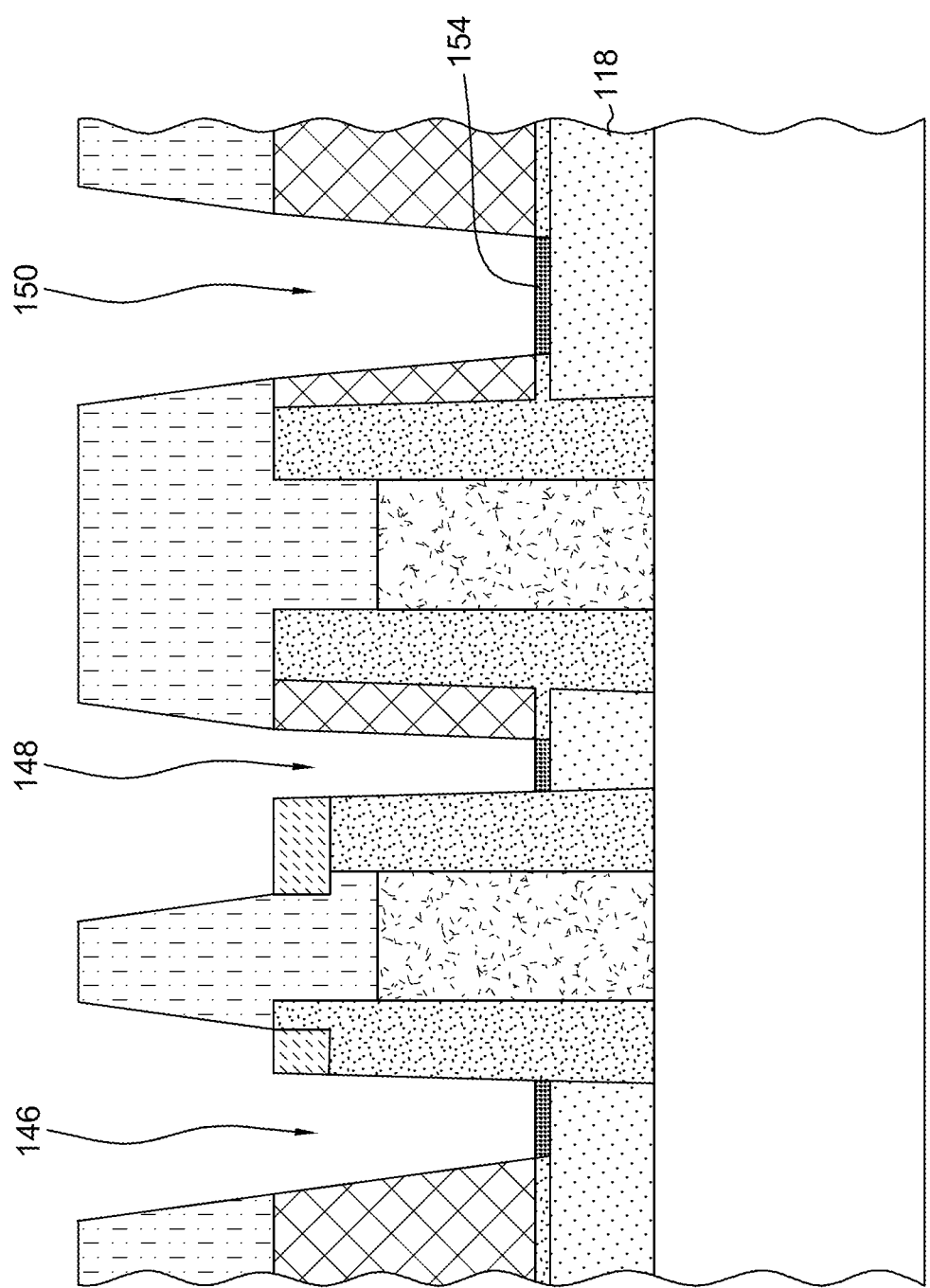
FIG. 5 depicts one example of the structure of FIG. 4 after exposing portions of the sources/drains, which extends the contact openings downward, forming extended contact openings, and forming silicide at the bottom of the extended contact openings, in accordance with one or more aspects of the present invention.

FIG. 5 depicts one example of the structure of FIG. 4 after exposing portions of the sources/drains (e.g., source/drain 118), which extends the contact openings (130, 132, 134) downward, forming extended contact openings 146, 148 and 150, respectively, and forming silicide 154 at the bottom of the extended contact openings, in accordance with one or more aspects of the present invention.

Figure 6:
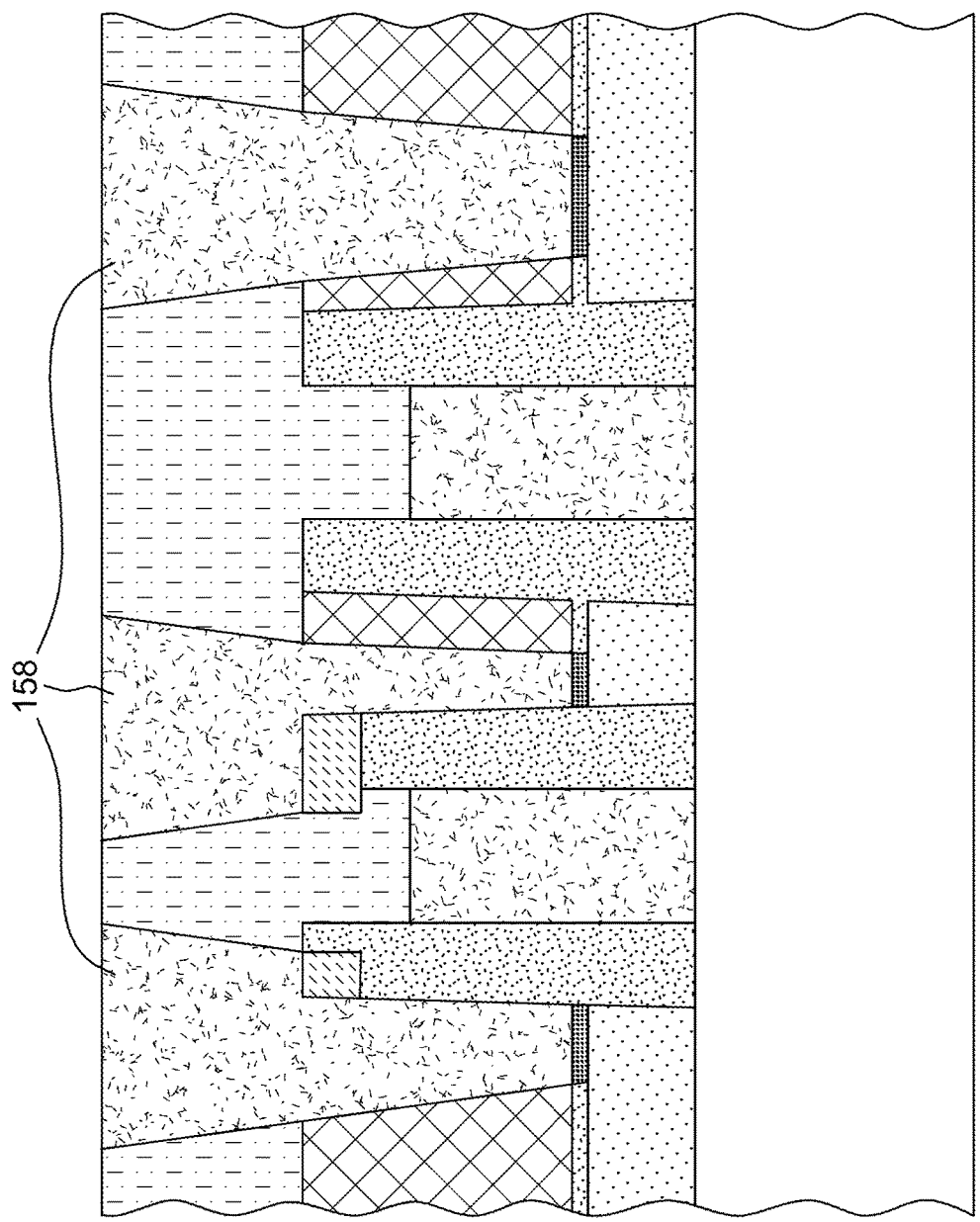
FIG. 6 depicts one example of the structure of FIG. 5 after filling the extended contact openings with conductive material (e.g., tungsten) over the silicide, forming source/drain contacts, in accordance with one or more aspects of the present invention.

FIG. 6 depicts one example of the structure of FIG. 5 after filling the extended contact openings (FIGS. 5, 146, 148 and 150) with conductive material over the silicide 154, for example, conductive metal (e.g., tungsten), forming source/drain contacts, in accordance with one or more aspects of the present invention.

Figure 7:
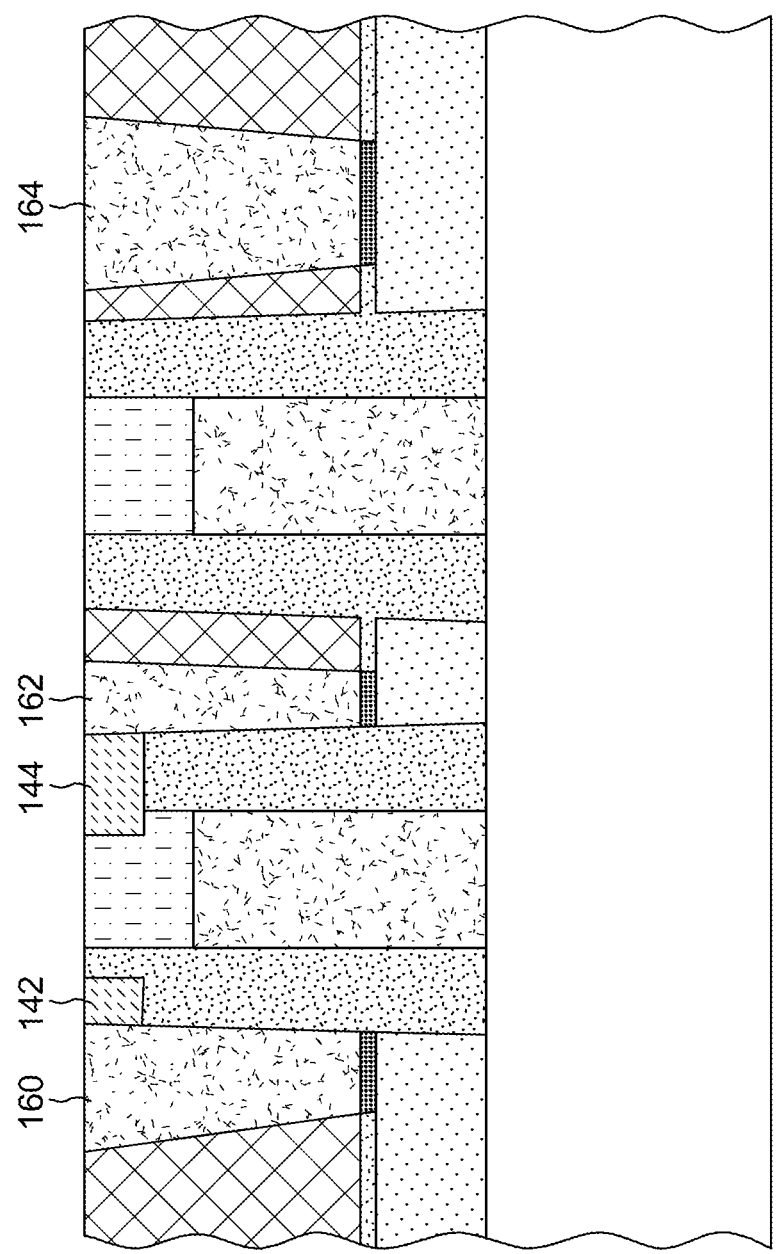
FIG. 7 depicts one example of the structure of FIG. 6 after planarizing the structure using the filled divots as a stop, leaving bottom contact portions, in accordance with one or more aspects of the present invention.

FIG. 7 depicts another example of the structure of FIG. 6 after removing top portions of the contacts by, for example, planarizing the structure and stopping on the filled divots 142 and 144, leaving bottom contact portions 160, 162 and 164, in accordance with one or more aspects of the present invention. In one example, the planarizing may be accomplished using a polishing process (e.g., a chemical-mechanical polishing process).

Figure 8:
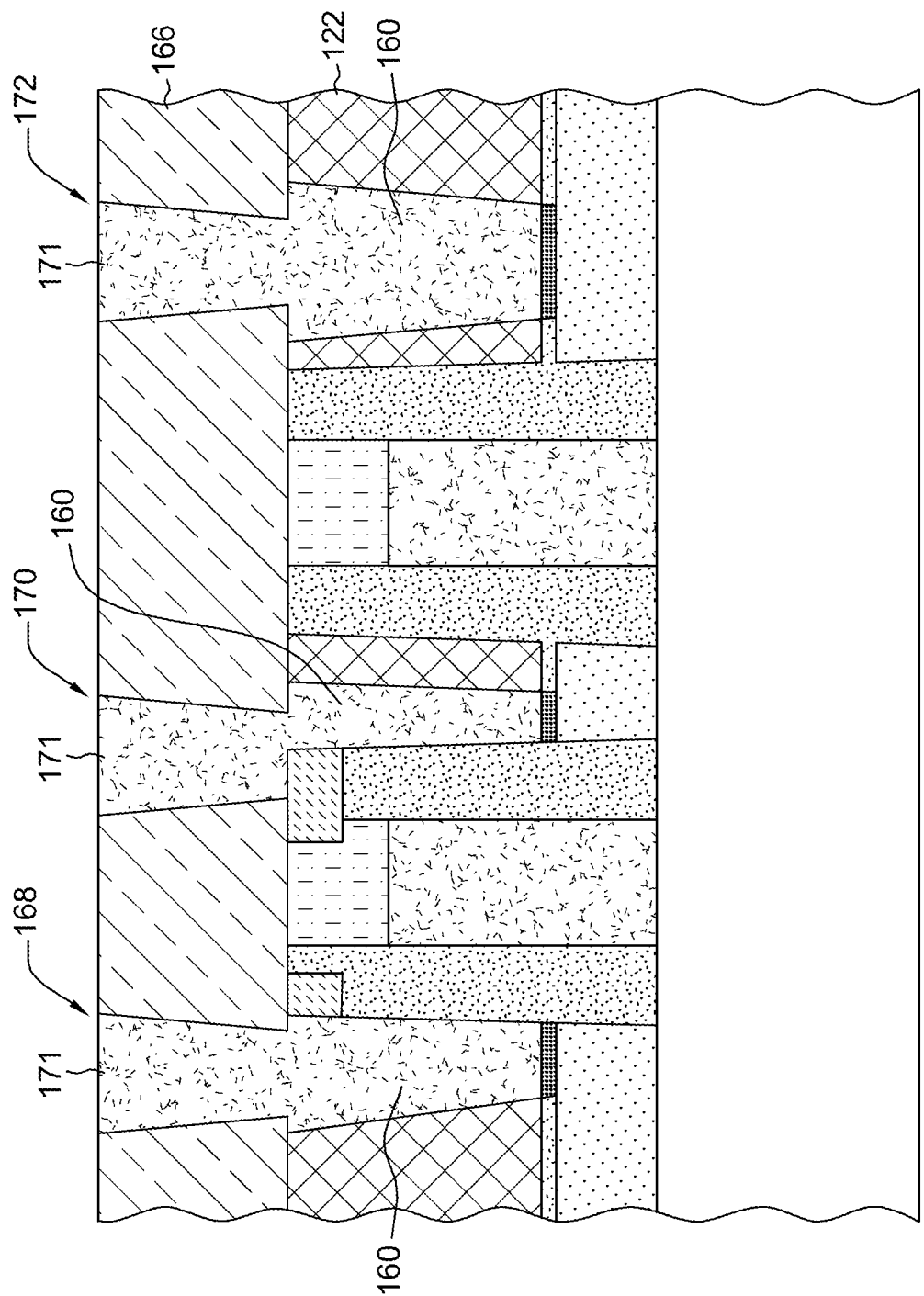
FIG. 8 depicts one example of the structure of FIG. 7 after forming a top dielectric layer over the bottom dielectric layer, removing portions thereof to form top contact openings, and filling the top contact openings with conductive material, which forms top contact portions over the bottom contact portions, in accordance with one or more aspects of the present invention.

FIG. 8 depicts one example of the structure of FIG. 7 after forming a top dielectric layer 166 over lower dielectric layer 122, removing portions of the top dielectric layer to form top contact openings 168, 170 and 172, and filling the top contact openings with conductive material 158, which forms top contact portions 171 over bottom contact portions 160, in accordance with one or more aspects of the present invention.

In one example, top dielectric layer 166 can be the same (e.g., an oxide) or different dielectric material than that of bottom dielectric layer 122. In one example, the top dielectric layer may have a lower dielectric constant k than the bottom dielectric layer, for example, the bottom dielectric layer may be an oxide, while the top dielectric layer may be a Back-End-Of-The-Line (BEOL) low-k dielectric. Where the top dielectric layer is a lower k value than the bottom dielectric layer, the lower k dielectric serves to reduce parasitic capacitance, comparatively.

Figure 9:
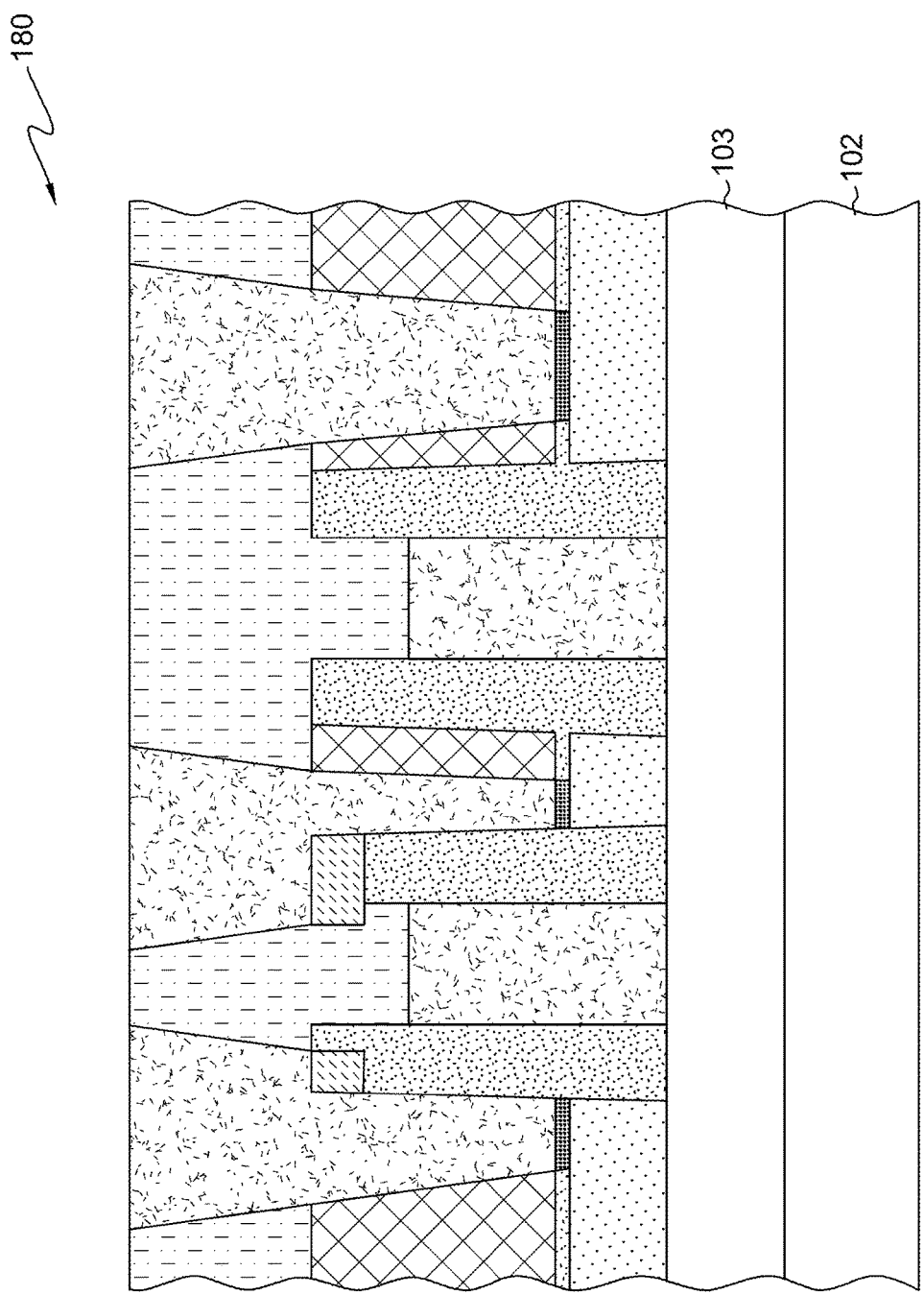
FIG. 9 is a cross-sectional view taken across a fin of one example of a semiconductor structure similar to that of FIG. 6, but including a fin on the substrate, in accordance with one or more aspects of the present invention.

FIG. 9 is a cross-sectional view taken along a fin of one example of a semiconductor structure 180 similar to that of FIG. 6, but including fin 103 on substrate 102, in accordance with one or more aspects of the present invention.

Figure 10:
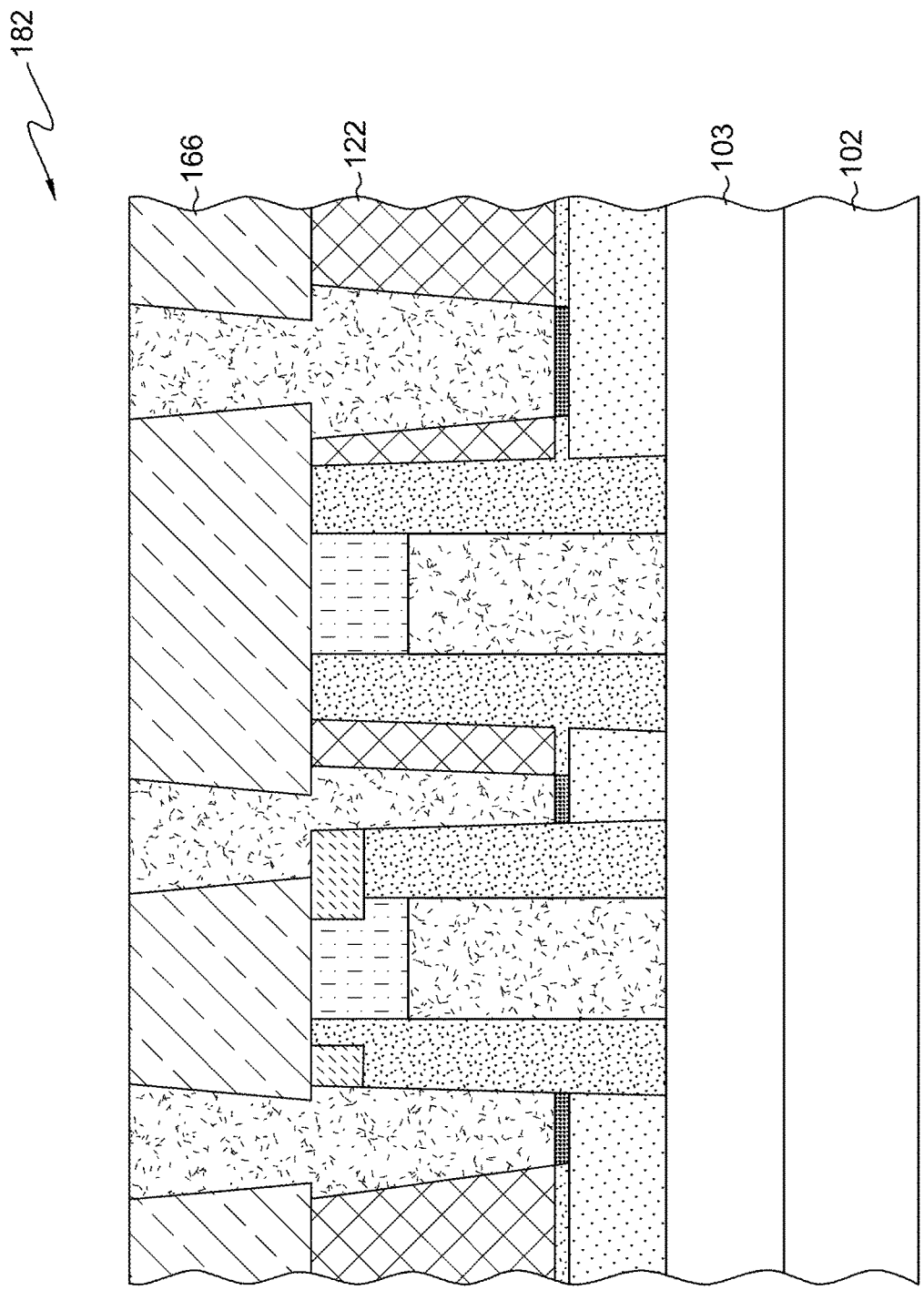
FIG. 10 is a cross-sectional view taken across a fin of one example of a semiconductor structure similar to that of FIG. 8, but including fin a on the substrate, in accordance with one or more aspects of the present invention.

FIG. 10 is a cross-sectional view taken along a fin of one example of a semiconductor structure 182 similar to that of FIG. 8, but including fin 103 on substrate 102, in accordance with one or more aspects of the present invention.

In a first aspect, disclosed above is a method. The method includes providing a starting structure, the starting structure including a semiconductor substrate, sources and drains, a hard mask liner layer over the sources and drains, a bottom dielectric layer over the hard mask liner layer, metal gates between the sources and drains, the metal gates defined by spacers, gate cap openings between corresponding spacers and above the metal gates, and a top dielectric layer above the bottom dielectric layer and in the gate cap openings, resulting in gate caps. The method further includes removing portions of the top dielectric layer, the removing resulting in contact openings and divot(s) at a top portion of one or more of the spacers and gate caps, and filling the divot(s) with etch-stop material, the etch-stop material having an etch-stop ability better than a material of the spacers and gate cap.

In one example, filling the divot(s) includes forming a etch-stop liner layer over the top dielectric layer and in the contact openings, and removing the etch-stop liner layer except in the divot(s).

In one example, the method of the first aspect may further include, for example, exposing the sources and drains, the exposing extending the contact openings downward to form extended contact openings. In one example, the method may further include, for example, forming contacts in the extended contact openings.

In one example, the method may further include, for example, forming silicide at a bottom of the extended contact openings, filling the extended contact openings with contact material over the silicide, and planarizing down to and stopping at the divot(s) with etch-stop material, resulting in bottom contact portions. In one example, the method may further include, for example, forming top contact portions over the bottom contact portions, the contact portions being at least partially in physical contact. In one example, forming the top contact portions may include, for example, forming a top blanket dielectric layer, removing portions of the top blanket dielectric layer, the removing forming top contact portion openings, and forming top contact portions in the top contact portion openings.

In a second aspect, disclosed above is a semiconductor structure. The semiconductor structure includes a semiconductor substrate, a source, a drain, a gate structure between the source and the drain, the gate structure including a conductive gate electrode and gate cap including a gate cap material, the gate cap being situated between a pair of spacers including a spacer material, a top portion of at least one of the pair of spacers and the gate cap having a divot therein filled with an etch-stop material, the etch-stop material having a better etch-stop ability than the spacer material and the gate cap material, and source contact(s) and drain contact(s), a respective contact covering each divot.

In one example, the spacer material may include, for example, a nitride, and the etch-stop material may include one of, for example, silicon carbonitride, hafnium dioxide and aluminum (III) oxide (II).

In one example, the semiconductor structure of the second aspect may further include, for example, a layer of silicide at a boundary between each of the source and the drain and the source contact and the drain contact, respectively.

In one example, each of the source contact and the drain contact of the semiconductor structure of the second aspect may be, for example, one continuous contact, a top portion of which is surrounded by a layer of a material of the gate cap.

In one example, each of the source contact(s) and the drain contact(s) of the semiconductor structure of the second aspect may include, for example, a lower contact portion and an upper contact portion at least partially in physical contact and each surrounded by dielectric material.

In one example, the semiconductor structure of the second aspect may further include, for example, a fin on the semiconductor substrate, the source and the drain being integral with a top portion of the fin, and the gate electrode covering a portion of the fin between the source and the drain. In one example, the spacer material may include, for example, a nitride, and the etch-stop material may include, for example, one of silicon carbonitride, hafnium dioxide and aluminum (III) oxide (II).

In one example, the semiconductor structure with fin may further include, for example, a layer of silicide at a boundary between each of the source and the drain and the source contact and the drain contact, respectively.

In one example, where fin(s) are included, each of the source contact and the drain contact may be one continuous contact, a top portion of which is surrounded by a layer of the gate cap material.

In one example, where fin(s) are included, each of the source contact(s) and the drain contact(s) may include, for example, a lower contact portion and an upper contact portion, the contact portions being at least partially in physical contact and each surrounded by dielectric material.

In one example, the divot(s) of the semiconductor structure of the second aspect may have, for example, a width that is less than a width of a spacer of the pair of spacers.

In one example, the divot(s) of the semiconductor structure of the second aspect may have, for example, a width that is greater than a width of a spacer of the pair of spacers, the divot(s) being situated at a top portion of both a spacer and an adjacent gate cap.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
    a semiconductor substrate;
    a source;
    a drain;
    a gate structure between the source and the drain, the gate structure comprising a conductive gate electrode and gate cap comprising a gate cap material, the gate cap being situated between a pair of spacers comprising a spacer material, a top portion of the gate cap having at least one divot therein filled with an etch-stop material, the etch-stop material having a better etch-stop ability than the spacer material and the gate cap material, wherein the etch-stop material is present only in the at least one divot; and
    at least one source contact and at least one drain contact, a respective contact covering each of the at least one divot.

2. The semiconductor structure of claim 1, wherein the spacer material comprises a nitride, and wherein the etch-stop material comprises one of silicon carbonitride, hafnium dioxide and aluminum (III) oxide (II).

3. The semiconductor structure of claim 1, further comprising a layer of silicide at a boundary between each of the source and the drain and the source contact and the drain contact, respectively.

4. The semiconductor structure of claim 1, wherein each of the source contact and the drain contact is one continuous contact, a top portion of which is surrounded by a layer of a material of the gate cap.

5. The semiconductor structure of claim 1, wherein each of the at least one source contact and the at least one drain contact comprises a lower contact portion and an upper contact portion at least partially in physical contact and each surrounded by dielectric material.

6. The semiconductor structure of claim 1, further comprising a fin on the semiconductor substrate, the source and the drain being integral with a top portion of the fin, and the gate electrode covering a portion of the fin between the source and the drain.

7. The semiconductor structure of claim 1, wherein the at least one divot has a width that is less than a width of a spacer of the pair of spacers.

8. The semiconductor structure of claim 1, wherein the at least one divot has a width that is greater than a width of a spacer of the pair of spacers, the at least one divot being situated at a top portion of both a spacer and an adjacent gate cap.

9. The semiconductor structure of claim 6, wherein the spacer material comprises a nitride, and wherein the etch-stop material comprises one of silicon carbonitride, hafnium dioxide and aluminum (III) oxide (II).

10. The semiconductor structure of claim 6, further comprising a layer of silicide at a boundary between each of the source and the drain and the source contact and the drain contact, respectively.

11. The semiconductor structure of claim 6, wherein each of the source contact and the drain contact is one continuous contact, a top portion of which is surrounded by a layer of the gate cap material.

12. The semiconductor structure of claim 6, wherein each of the at least one source contact and the at least one drain contact comprises a lower contact portion and an upper contact portion, the lower contact portion and the upper contact portion being at least partially in physical contact and each surrounded by dielectric material.

* * * * *